4,283,462

United States Patent [19]

Meyer et al.

[11] 4,283,462
[45] Aug. 11, 1981

[54] PHENOLIC LAMINATES WITH FURAN RESIN COATING

[75] Inventors: Nicolas Meyer, Bully les Mines; Léon Schuller, Noisy le Roi, both of France

[73] Assignee: Societe Chimiques des Charbonnages, Paris, France

[21] Appl. No.: 114,877

[22] Filed: Jan. 24, 1980

[30] Foreign Application Priority Data

Jan. 25, 1979 [FR] France ............................. 79 01888

[51] Int. Cl.³ .............................................. B32B 27/08
[52] U.S. Cl. ............................... 428/506; 156/307.3; 156/307.7; 264/255; 264/257; 264/258; 264/309; 428/524; 428/525
[58] Field of Search ............ 428/524, 525, 506; 264/255, 257, 258, 309; 156/307.3, 307.7, 228, 335

[56] References Cited

U.S. PATENT DOCUMENTS

| 3,094,453 | 6/1963 | Scherer | 156/334 |
|---|---|---|---|
| 3,416,990 | 12/1968 | Robinson | 156/334 |

FOREIGN PATENT DOCUMENTS 258722  12/1960  Australia ............................. 428/525

Primary Examiner—Thomas J. Herbert, Jr.
Assistant Examiner—E. Rollins Buffalow
Attorney, Agent, or Firm—Millen & White

[57] ABSTRACT

In reinforced phenolic resin laminates coated with a surface layer on at least one side, the improvement wherein said surface layer consists essentially of a furan resin coating which is directly bonded to the reinforced phenolic resin laminate, thereby removing surface irregularities in the resultant laminate.

13 Claims, No Drawings

PHENOLIC LAMINATES WITH FURAN RESIN COATING

BACKGROUND OF THE INVENTION

This invention relates to laminates of reinforced phenolic resins coated with a final surface layer to remove surface irregularities.

Laminates comprising several successive layers of phenolic resins impregnated reinforcing agents are known in the art (see for example "Encyclopedia of Polymer Science and Technology", Interscience publishers 1970, Volume 12, page 1, "Reinforced plastics" and volume 8, page 121 "Laminates", and Modern Plastics Encyclopedia, 1975-76, volume 52, pages 153-158).

The phenolic resin generally used is a resol obtained by condensation of an aldehyde and a phenol in a basic medium, usually by condensation of formaldehyde and phenol in the presence of caustic soda. The curing or hardening of the resultant phenolic resin, i.e. cross linking in a three-dimensional system, is achieved by using an acid catalyst, for instance, hydrochloric acid, sulfuric acid, phosphoric acid, oxalic acid, benzenesulfonic acid, paratoluenesulfonic acid, phenol-sulfonic acid.

The reinforcing agent comprises fiber forms such as cellulosic fibers, glass fibers, non-woven materials made of large molecular weight polyesters or of polyvinyl chloride, or glass mats or woven material for example of aromatic polyamides, glass or asbestos.

The manufacture of reinforced laminates is achieved by any of several methods. According to one process, the reinforcing agent used in the form of a woven or non-woven material is impregnated with a resin; the impregnation is completed by using a roll mill or a press; then several impregnated layers of reinforcing agent are brought together. Laminates can be also obtained by winding of a filament impregnated with a resin. According to still another process, fibers are cast on a layer of resin previously poured on the surface of a mold, the pouring of the resin and casting of fibers being alternatively performed until the desired thickness is obtained.

Though well known, and a work horse of the industry since the 1920's, laminates based on phenolic resins still have significant drawbacks. In particular, they contain surface irregularities such as little holes, pocks, and fibers at and near the surface thereof projecting out over the surface. To obtain a smooth surface, it has been proposed to coat the laminate articles with a coating such as paint manufactured with a polyurethane binder, but the surface of the obtained article is not always smooth. A smooth surface can only be obtained by applying a primer coating or filler, e.g., a polyurethane resin, which plugs the pores, polishing the plugged surface and then painting the polished surface.

It has been also proposed to manufacture these laminates by pouring a resin layer on the surface of a mold, the resin layer being usually named "gel-coat". With a gel-coat comprising a thin layer of filled or unfilled phenolic resin, the resultant surface still exhibits irregularities such as small pits, and the imprint of the fibers also appears on the surface thereof. Whereas surface irregularities could theoretically be removed by using a thicker layer of phenolic resin, small cracks or crazing appears on the surface.

The same drawbacks are observed when using a gel-coat by an unsaturated polyester resin. Moreover, by using phenolic resins or unsaturated polyester resins, the resultant hardness of the surface becomes insufficient.

SUMMARY OF THE INVENTION

An object of this invention is to provide laminates reinforced phenolic resins coated with a surface layer, these articles having no surface irregularities due to pitting or fiber projections even after long storage times.

Another object is to provide laminates having improved surface hardnesses and which can be coated with a surface point, without any priming step or preliminary polishing step being necessary.

Upon further study of the specification and appended claims, further objects and advantages of this invention will become apparent to those skilled in the art.

To attain these objects, laminates of reinforced phenolic resins are coated with a surface layer on at least one side, said surface layer comprising a furan resin directly bonded to the reinforced phenolic resin.

It has been found that laminates having a smooth surface and an improved surface hardness are obtained by using a furan resin. Moreover, the resultant coating has an improved resistance to alkali chemical agents. According to French Standard NF P 92501, the resultant laminate article is classified M1, indicating non-inflammability.

When laminates having a surface color different from the color of furan resin are desired, a further colored layer of a thermosetting resin such as unsaturated polyester resin, epoxy resin or polyurethane resin is applied to the furan resin. The furan resin layer may be also coated with a clear varnish as well.

Furan resins are conventional and are generally manufactured by condensing in an acid medium a composition containing furfuryl alcohol. Cross-linking or hardening is achieved according to known methods by using an acidic catalyst. This acid is either an arylsulfonic acid as benzenesulfonic acid, phenolsulfonic acid, paratoluenesulfonic acid or a mixture constituted by the aforesaid acids, and strong mineral acids such as sulfuric acid or phosphoric acid.

Before hardening, the furan resin may be further modified by the incorporation of known mineral fillers, surface tension lowering (spreading) agents, solvent, and thixotropic agents.

There are many conventional suitable mineral fillers which do not react with acids, and the spreading agent is chosen among known products, such as silicone oils, for example. The thixotropic agent is chosen among pyrogenic silica, bentonite, asbestos fibers filled with amorphous silica, among others.

By using a solvent such as acetone, for example, it is possible to obtain a fluid resin suitable for spraying with a spray-gun.

Catalyzed furan resin, optionally combined with one or more additives may be coated on a pre-prepared phenolic laminate. Preferably, however, the furan resin layer is applied by the gel-coat technique. According to this conventional technique, a layer containing a furan resin is laid on one or two sides of a mold and then after at least partial hardening thereof, successive alternating layers of phenolic resin and reinforcing agent are added. The resultant laminate article is then cured and withdrawn from the mold.

According to another preferred method of preparing the laminate of the present invention, furan resin containing the acid catalyst and possibly one or several adjuvants is laid manually or by using a spray-gun on a mold in order to obtain a layer having a variable thickness, generally ranging between 0.1 and 2 millimeters. Most often the thickness is equal to less than 1.0 millimeter. As known in the gel-coat laminating technique, it is possible to achieve laminates either by hot or cold compression, or by injection, or by utilizing the fibrous winding technique.

It has been found that the lamination step on a substantially hardened layer consisting essentially of a furan resin is possible. Contrary to experience with phenolic resins or unsaturated polyester resin wherein this step is not possible, the binding between the substantially hardened gel-coat of furan resin and the laminate article is excellent, and no separation is observed between the gel-coat and the laminate article. By "substantially hardened" is meant that the furan resin is non-tacky and dry to the touch. Thus by achieving a such process it is possible to use furan resins which are hardened, thereby avoiding the necessity of using resin quickly before the hardening is over. However the lamination can also be achieved by using a furan resin which is hardened in part.

When there is prepared a laminate having a surface layer of a different color from that of the furan resin, a first layer of a thermosetting resin containing the colored filler and/or pigment, and hardened catalyst is first laid on the mold and is hardened at least in part. Then as described above, a second layer of a furan resin is laid upon the first layer, and this second layer is hardened at least in part. Then, by utilizing the laminating technique, a phenolic resin and a reinforcing agent are deposited. After hardening of the phenolic resin, the resultant laminate is withdrawn from the mold.

Suitable phenolic resins for use in the laminate articles according to the present invention include, but are not limited to, the known resols, in particular resol obtained by condensing formaldehyde and phenol in the presence of sodium hydroxide.

The hardening or curing (cross linking) is obtained by adding a conventional acid catalyst: paratoluene sulfonic acid is preferably used because it is suitable for hardening phenolic resin and furan resin. For these reasons, a paratoluene sulfonic acid aqueous solution is used for the hardening of both of these resins.

Different conventional adjuvants can be added to the phenolic resins, for instance fillers, solvents, plasticizers, etc. By using as a plasticizer, a polyalcohol such as dipropylene glycol, laminates having an excellent bending strength are obtained. The preferred reinforcing agent used with the phenolic resins is fiber-glass.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever. In the following examples, all temperatures are set forth uncorrected in degrees Celsius; unless otherwise indicated, all parts and percentages are by weight.

EXAMPLE 1

A layer of furan resin of a thickness of 0.2 millimeters was coated by brushing on a mold which had been preliminarily treated with "Carnauba", a hard wax, used as a mold release agent. The furan resin had the following composition: (amounts are given in parts per weight)

| | |
|---|---|
| Condensate of furfuryl alcohol in acid medium (Resin QUACCOR 1001-Trademark of QUAKER OATS Company) | 100 parts |
| Pyrogenic silica | 2 parts |
| Aqueous solution of paratoluene sulfonic acid | 3 parts | containing 65 percent by weight of acid. The furan resin layer was hardened at room temperature for 20 minutes to obtain a slightly tacky surface. A fiber-glass mat was deposited on this layer, followed by a phenolic resin coating. The phenolic resin coating system had the following composition:

100 parts of phenolic resin 10 parts of dipropylene-glycol 10 parts of an aqueous solution of 65% by weight paratoluene-sulfonic acid.

The phenol resin itself was obtained by condensing formol with phenol in a molar ratio $$\frac{formol}{phenol} = 1.5;$$

its viscosity was equal to 10 poises at 20° C. and its dried extract was equal to 75% by weight (determined by heating 4 g of resin at 140° C. for 3 hours. The phenolic resin was layered on the fiber-glass mat by using roller means. The ratio by weight $$\frac{\text{fiber-glass mat}}{\text{phenolic resin}}$$

was equal to $\frac{1}{3}$. After hardening at room temperature for 4 hours, there was obtained a laminate free of surface irregularities on the furan resin side and which had a smooth surface reproducing the surface mold.

EXAMPLE 2

Example 1 was repeated but the furan resin was substantially hardened (its surface was dry to the touch) and a pre-catalyzed phenolic resin was deposited before laying out the fiber-glass mat. Then, as in Example 1, phenolic resin was added.

After hardening, there was obtained a laminate which showed a tenacious bond with the furan resin coating.

EXAMPLE 3

The mold used in Example 1 and coated with the same mold release agent was placed on a press and heated at 80° C. By using a spray gun, there was deposited a coating of 0.2 millimeters thickness having the following composition: (in parts by weight)

| | |
|---|---|
| The furan resin used in Example 1 | 100 parts |
| Pyrogenic silica | 2 parts |
| Acetone | 10 parts |
| An aqueous solution of 65% by weight | 3 parts | paratoluene sulfonic acid. The hardening of the resin was rapid, surface hardening occurring after only one minute. A fiber-glass mat was placed on this surface. Then the phenolic resin used in Example 1 was poured. The weight ratio $$\frac{\text{fiber-glass mat}}{\text{resin}}$$

was equal to ⅓. The press was closed. After 10 minutes a laminate free of surface irregularities was obtained.

EXAMPLE 4

Example 3 was repeated but using a layer thickness of furan resin equal to 1 millimeter. After storage for several months, the resultant laminate was free of cracks.

EXAMPLE 5

Example 2 was repeated but furan was deposited on both sides of the mold. A glass-fiber mat was deposited on both layers which were substantially hardened. The mold was closed and the phenolic resin used in Example 1 was injected. After hardening for one hour at 50° C. a laminate article which was free of surface irregularities on both sides was obtained.

EXAMPLE 6

Using the same mold and mold release agent of Example 1, there was deposited a coating, 0.2 millimeters in thickness, of an unsaturated polyester resin. The latter resin was of the isophthalic acid type and contained trichloroethylphosphate and titanium dioxide. According to the process described in Example 2, there was deposited on the polyester layer, a furan resin layer, phenolic resin and fiber-glass mat. After hardening and withdrawing from the mold, there was obtained a laminate article having (from the polyester gel-coat side) a white and very smooth surface.

Suitable furan resins for use in the laminate articles according to the present invention are conventional and are obtained by polymerization of furfuryl alcohol. Furfural can be added to the furfuryl alcohol polymer as a solvent.

The furfuryl alcohol polymers used in the present invention are dark liquids with viscosities of 50 to 15,000 centipoises: for instance polymers sold by Quaker Oats under the following trade marks are used: "QUACCOR 1001, QUACCOR 1300 and QUACCOR 4611".

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A process for producing a reinforced phenolic resin laminate coated with a surface layer on at least one side, said surface layer consisting essentially of a furan resin coating which is directly bonded to the reinforced phenolic resin laminate, comprising depositing said coating of furan resin on a mold, then after at least a beginning of hardening, depositing alternate layers of phenolic resin and reinforcing agent, hardening the laminate, and then withdrawing resultant laminate from the mold, said laminate having no surface irregularities due to pitting or fiber projection.

2. A process according to claim 1, wherein the furan resin is substantially hardened prior to said depositing of alternate layers.

3. A process according to claim 1, wherein the furan resin is hardened by using an aqueous concentrated solution of paratoluenesulfonic acid.

4. A process according to claim 1, wherein the phenolic resin is obtained by condensing formol and phenol in the presence of a basic agent, and it contains a plasticizer.

5. A process according to claim 7, wherein the thermosetting resin is an unsaturated polyester resin.

6. A process according to claim 7, wherein the thermosetting resin is pigmented.

7. A process according to claim 1, said furan resin coating being directly bonded on the obverse side with a thermosetting coating, and wherein the process comprises the preceding step of depositing a first layer of said thermosetting resin on the mold as the first layer, and hardening the first layer at least in part prior to depositing the furan layer.

8. A process according to claim 7, wherein the furan resin is substantially hardened prior to said depositing of alternate layers.

9. A laminate produced according to claim 1.
10. A laminate produced according to claim 2.
11. A laminate produced according to claim 7.
12. A laminate produced according to claim 5.
13. A laminate produced according to claim 8.

* * * * *